United States Patent [19]

Colavin

[11] Patent Number: 5,754,615
[45] Date of Patent: May 19, 1998

[54] FAST PROGRAMMABLE DIVIDER

[75] Inventor: Osvaldo Colavin, Voreppe, France

[73] Assignee: SGS-Thomson Microelectronics S.A., Saint Genis, France

[21] Appl. No.: 657,460

[22] Filed: May 29, 1996

[30] Foreign Application Priority Data

May 31, 1995 [FR] France .................. 95 06667

[51] Int. Cl.$^6$ ................ H03K 21/00; H03K 21/16
[52] U.S. Cl. .................................. 377/47; 377/116
[58] Field of Search ......................... 377/47, 116

[56] References Cited

U.S. PATENT DOCUMENTS

| 4,951,303 | 8/1990 | Larson | 377/110 |
|---|---|---|---|
| 5,077,764 | 12/1991 | Yamashita | 377/116 |

FOREIGN PATENT DOCUMENTS

| A-32 00 752 | 7/1983 | Germany | H03K 21/36 |
|---|---|---|---|
| 60-10923 | 1/1985 | Japan | 377/47 |
| 385920 | 4/1991 | Japan | 377/47 |

OTHER PUBLICATIONS

Patent Abstracts of Japan, vol. 5, No. 181 (E-38)[8531], Nov. 20, 1981 & JP-A-56 107636 (Tateshi Denki K.K.).

Primary Examiner—Margaret Rose Wambach
Attorney, Agent, or Firm—Wolf, Greenfield & Sacks, P.C.

[57] ABSTRACT

This invention relates to a programmable frequency divider that includes a plurality of flip-flops that are clocked at a frequency to be divided. The plurality of flip-flops is operatively arranged to allow the connection in a ring of a predetermined number of them, selected according to a desired frequency division ratio. In one embodiment, the smallest selectable ring includes at least two successive flip-flops that are initialized to a first state, immediately followed by at least two successive flip-flops that are initialized to the opposite state.

25 Claims, 2 Drawing Sheets

FAST PROGRAMMABLE DIVIDER

BACKGROUND OF THE INVENTION

1. Field of the Invention

This invention relates to a fast programmable divider for dividing a high frequency, for example the frequency of a controlled oscillator of a phase-locked loop, by a variable ratio.

2. Discussion of the Related Art

FIG. 1 shows a conventional programmable divider. This divider includes a counter 1 clocked at the frequency to divide Fin. The contents of counter 1 are compared to a number N by a comparator 3. In case of equality, comparator 3 supplies a reset signal RST to counter 1. The divided frequency Fout to obtain is, for example, the reset signal RST. Indeed, comparator 3 normally provides a pulse each time counter 1 has counted N periods of signal Fin. For counter 1 to be as fast as possible, it is of asynchronous type, that is, its bits do not vary in phase with frequency Fin.

With a programmable divider of the type of FIG. 1, an operating speed close to the maximum frequency admitted by the implementation technology of the divider can be reached. However, this performance is obtained at the cost of considerable effort for dimensioning each of the transistors of the divider, as the dimensioning cannot be transposed from one technology to another. Thus, in particular, each time a new technology appears, considerable development effort must occur to operate a divider of the type of FIG. 1 at the maximum possible frequency.

SUMMARY OF THE INVENTION

An object of the present invention is to provide a structure of a fast programmable divider which can be transposed from one technology to another without any significant development effort.

In one of the illustrative embodiments of the invention, this object is achieved by a programmable divider including several flip-flops clocked at a frequency to divide and operatively arranged so as to allow the connection in a ring of a predetermined number of them, selected according to a desired division ratio, the smallest selectable ring including at least two successive flip-flops initialized at a first state, immediately followed by at least two successive flip-flops initialized at the opposite state.

According to another embodiment of the present invention, an output of each flip-flop which does not belong to the smallest selectable ring is provided to a first input of a multiplexer having a second input which receives the output of the last flip-flop of the smallest selectable ring, and an output which is provided to the input of the next flip-flop, this multiplexer being controlled by a signal indicating the desired division ratio.

According to a further embodiment of the present invention, all flip-flops which do not belong to smallest selectable ring are initialized at a same state.

According to another embodiment of the present invention, the flip-flops are initialized by a signal which is not synchronized on the frequency to divide.

BRIEF DESCRIPTION OF THE DRAWINGS

These objects, features and advantages, as well as others, of the present invention will be discussed in detail in the following description of specific embodiments, taken in conjunction with the following drawings, but not limited by them, in which.

DETAILED DESCRIPTION

Figure 2A:
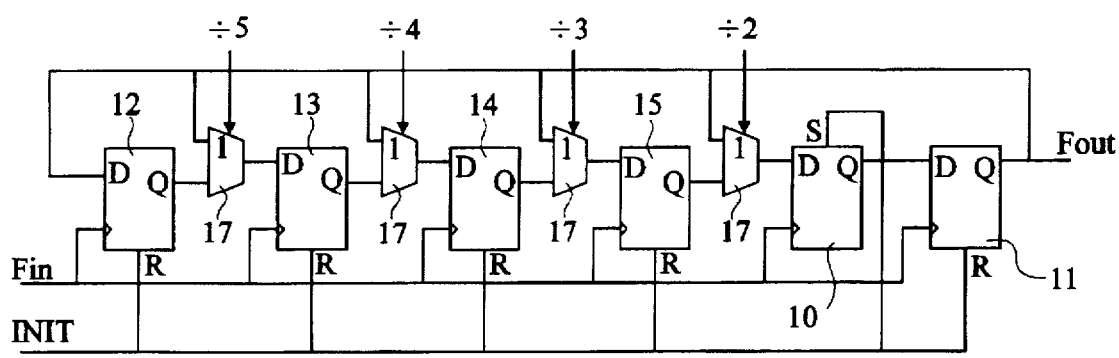
FIG. 2A shows a programmable divider according to an embodiment of the present invention.

In FIG. 2A, according to an embodiment of the invention, several flip-flops are connected in a variable size ring, the total number of flip-flops being equal to the maximum division ratio to obtain. The flip-flops are of the D type, that is, each of them stores the state present at its input at the arrival of an active rising edge of an enable signal. The divider of FIG. 2A includes six D flip-flops 10 to 15, each of them being enabled at the frequency Fin to be divided. The first three flip-flops 10 to 12 are directly connected in cascade, that is, the output Q of each of these flip-flops is connected to the input D of the following flip-flop. The output Fout of the divider is taken at the output Q of the second flip-flop 11. The input D of each of flip-flops 13 to 15 and 10 is preceded by a multiplexer 17 which receives on a first input the output Q of the preceding flip-flop and, on a second input, the output Fout of the divider. In addition, all flip-flops except one of flip-flops 10 and 11, for example 10, are reset by an initialization signal INIT, flip-flop 10 instead being set to 1 by this signal.

Signal INIT is activated only once, for example when the circuit is turned on. Consequently, only flip-flop 10 is at 1. When signal Fin to divide is applied, this "1" starts circulating at the rate of signal Fin in the flip-flops of a ring selected by means of multiplexers 17. When none of these multiplexers 17 is controlled, that is, when all the control signals of these multiplexers are at 0, the selected ring includes all flip-flops 10 to 15. In this case, a ring of six contiguous flip-flops is formed, where flip-flop 11 is contiguous not only with flip-flop 10, but also with flip-flop 12 as the ring wraps around. To select a smaller ring, the control signal of one multiplexer 17 is set to 1. For example, if the control signal of the multiplexer 17 preceding flip-flop 15 is set to 1, the ring will include flip-flops 10, 11 and 15; the division ratio then selected is 3. Indeed, the "1" which was initially in flip-flop 10 then reaches flip-flop 11, and is presented to output Fout of the divider, at each three cycles of signal Fin to divide.

When passing from a given ring to a smaller one, the circulating "1" may not be inside the smaller ring. This should be avoided, since the circulating "1" is then lost. For this purpose, the selection of a new ring may be synchronized on the rising edges of signal Fout which indicate the presence of the circulating "1" in the smallest selectable ring, constituted by flip-flops 10 and 11.

The divider of FIG. 2A has the advantage of being synchronous, since all flip-flops 10 to 15 are rated by the same signal Fin. This enables to transfer the divider from one technology to another without worrying about the dimensions of the transistors. However, a limitation of this divider appears when used at a high frequency, this limitation being illustrated by FIG. 2B.

Figure 2B:
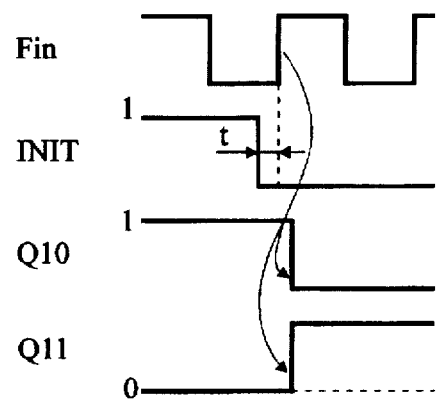
FIG. 2B shows a timing diagram illustrating the operation of the divider of FIG. 2A.

FIG. 2B shows exemplary waveforms of signals Fin, INIT and of outputs Q10 and Q11 of flip-flops 10 and 11. Initially, signal INIT is at 1, which forces the output of all flip-flops except flip-flop 10 to 0. Signal INIT changes to 0 a time interval t before a rising edge of signal Fin, which enables the divider to start. At the next rising edge of signal Fin, flip-flop 10 takes the state 0 of the preceding flip-flop (15 or 11) and flip-flop 11 takes the state 1 of flip-flop 10. As shown, signal Q10 changes from 1 to 0 and signal Q11 changes from 0 to 1.

For flip-flop 11 to take the state 1 of flip-flop 10, the interval t separating the falling edge of signal INIT from the rising edge of signal Fin must be greater than the flip-flop's setup time. If this condition is not met, as shown in dotted lines, flip-flop 11 remains at 0 instead of taking the state 1, which causes the loss of the circulating "1". Although a synchronization of the falling edge of signal INIT on signal Fin appears to be efficient at low frequencies, it is difficult, at higher frequencies, to control the position of the falling edge of signal INIT without reconsidering the dimensions of the transistors. Indeed, the offset between the falling edge of signal INIT and a rising edge of signal Fin depends on such dimensioning.

Figure 3:
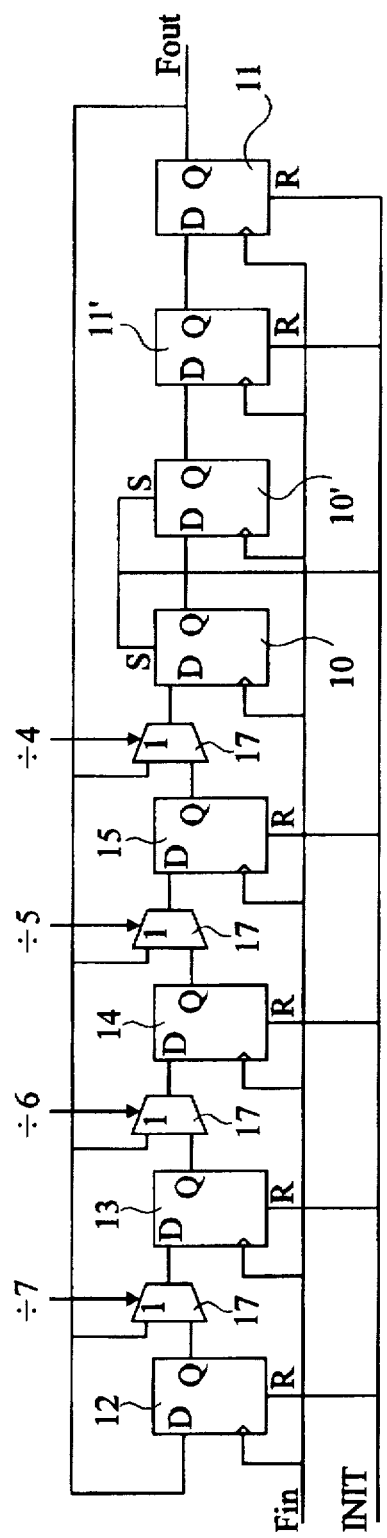
FIG. 3 shows a second embodiment of a programmable divider according to the present invention.

FIG. 3 shows a divider according to another embodiment of the invention, which is based on the divider of FIG. 2A, but avoids the possible loss of a circulating "1" at high frequencies. Here, as in FIG. 2A, several flip-flops 10 to 15 are connected in a variable size ring by means of multiplexers 17. Further, the circuit includes two additional flip-flops 10' and 11', which form the smallest selectable ring with flip-flops 10 and 11. Flip-flops 10' and 11' are arranged in succession between flip-flops 10 and 11. Flip-flop 10', like flip-flop 10, is set to 1 by signal INIT, while flip-flop 11', like flip-flop 11, is set to 0 by this signal INIT. It is not necessary, here, to synchronize signal INIT on signal Fin. The operation of this divider is similar to that of FIG. 2A, except that the minimal division ratio is 4, since the smallest selectable ring is constituted by the four flip-flops 10, 10', 11 and 11'.

After an initialization by signal INIT, flip-flops 10 and 11' can be in the conflicting situation discussed in relation with FIG. 2B. That is, flip-flop 10 stays at 1 instead of taking the state 0 of the preceding flip-flop (15 or 11), or flip-flop 11' remains at 0 instead of taking the state 1 of flip-flop 10'. Four cases are therefore possible:

1) all flip-flops operate correctly, flip-flops 10, 10', 11' and 11 respectively take states 0, 1, 1 and 0 at the rising edge of signal Fin.

2) Only flip-flop 10 does not operate correctly. Flip-flops 10, 10', 11' and 11 then respectively take states 1, 1, 1 and 0 at the rising edge of signal Fin.

3) Only flip-flop 11' does not operate correctly. Flip-flops 10, 10', 11' and 11 then respectively take states 0, 1, 0 and 0 at the rising edge of signal Fin.

4) None of flip-flops 10, 11' operates correctly. Flip-flops 10, 10', 11' and 11 then respectively take states 1, 1, 0 and 0 at the rising edge of signal Fin.

In all cases, from one to three consecutive "1"s are present in flip-flops 10, 10', 11' and 11, which will circulate in a ring, with the "0"s from the remaining flip-flops in the ring, at the rate of the frequency of signal Fin. As a result, the duty ratio of signal Fout varies according to the number of "1"s in circulation, but its frequency remains the same, equal to the frequency of signal Fin divided by the number of flip-flops in the selected ring. Thus, the bit pattern formed by the number of consecutive "1"s and "0"s circulates through the ring and repeats at output Q of flip-flop 11 at the frequency of signal Fout. This behavior is appropriate for most circuits which exploit the output of the divider, since they are typically only responsive to the rising or falling edges of the divider output. Of course, a similar correct operation can be obtained by increasing, in the smallest selectable ring, the number of flip-flops initially set to 1 (10, 10') or the number of flip-flops initially set to 0 (11, 11').

Figure 1:
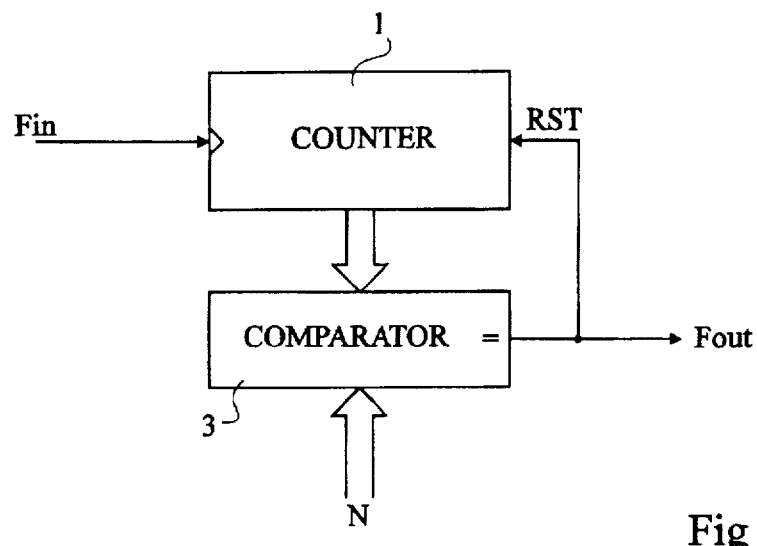
FIG. 1 shows a conventional programmable divider.

The minimum division ratio of the divider of FIG. 3 is 4. This, in fact, is not a disadvantage with respect to the conventional circuit of FIG. 1. Indeed, at high frequencies, in the conventional circuit, the operations of comparing the contents of counter 1 to number N and resetting counter 1 take a relatively long time. At the limit of the operating frequency, this time generally reaches three cycles. Since counter 1 must at least count to 1 for the divider to function, the minimum division ratio thus also appears to be 4.

Several alternatives and modifications will appear to those skilled in the art. For instance, instead of setting all flip-flops except at least two to 0, all flip-flops except at least two can be set to 1. Similarly, the flip-flops may be other than D-type flip-flops.

Having thus described at least one illustrative embodiment of the invention, various alterations, modifications, and improvements will readily occur to those skilled in the art.

Such alterations, modifications, and improvements are intended to be within the spirit and the scope of the invention. Accordingly, the foregoing description is by way of example only and is not intended as limiting. The invention is limited only as defined in the following claims and the equivalents thereto.

What is claimed is:

1. A programmable frequency divider comprising:
 a plurality of flip-flops to be clocked at a frequency to be divided, the plurality of flip-flops being operatively arranged to allow connection in a ring of a selectable number of the plurality of flip-flops, the number of the plurality of flips-flops in the ring being selected according to a desired frequency division ratio, wherein a smallest selectable ring of the plurality of flip-flops includes at least two successive flip-flops arranged to be initialized to a first state followed immediately by at least two successive flip-flops arranged to be initialized to a second state that is opposite the first state.

2. The programmable frequency divider of claim 1, wherein an output of each of the plurality of flip-flops that does not belong to the smallest selectable ring is provided to a first input of a corresponding multiplexer, each multiplexer having a second input that receives an output of a last flip-flop of the smallest selectable ring and having an output that is provided to an input of a next one of the plurality of flip-flops, wherein each multiplexer is controlled by a signal that indicates the desired frequency division ratio.

3. The programmable frequency divider of claim 1, wherein each of the plurality of flip-flops that is not included in the smallest selectable ring is arranged to be initialized to a same state.

4. The programmable frequency divider of claim 1, wherein each of the plurality of flip-flops has a clock input to receive an input signal at the frequency to be divided and an initialization input to receive an initialization signal that is not synchronized to the input signal.

5. A frequency divider for dividing an input signal having a period and a first frequency to generate an output signal having a second frequency, the frequency divider comprising:
 an input terminal to receive the input signal;
 an output terminal to provide the output signal; and
 a plurality of flip-flops coupled in series between the input and output terminals, each of the plurality of flip-flops having a clock input that receives a clock signal having a same period as the input signal;
 wherein the plurality of flip-flops is operatively arranged to form a ring of flip-flops that circulates, through the ring, one of a plurality of bit patterns that repeats at the output terminal at the second frequency, the one of the plurality of bit patterns being determined by which of the plurality of flip-flops form the ring.

6. A frequency divider for dividing an input signal having a first frequency to generate an output signal having a second frequency, the frequency divider comprising:

an input terminal to receive the input signal;

an output terminal to provide the output signal; and a plurality of flip-flops coupled in series between the input and output terminals, each of the plurality of flip-flops having a clock input to receive the input signal;

wherein the plurality of flip-flops is operatively arranged to form a ring of flip-flops that circulates, through the ring, a bit pattern that repeats at the output terminal at the second frequency; and wherein each of the plurality of flip-flops has an initialization input to receive an initialization signal, the initialization signal initializing at least one of the plurality of flip-flops to a first state and at least one of the plurality of flip-flops to a second state that is opposite the first state, the initialized state of each flip-flop in the ring determining the bit pattern that circulates through the ring.

7. The frequency divider of claim 6, wherein the at least one of the plurality of flip-flops initialized to the first state includes a first set of contiguous flip-flops in the ring, and the at least one of the plurality of flip-flops initialized to the second state includes a second set of contiguous flip-flops that includes all flip-flops in the ring other than those in the first set of contiguous flip-flops.

8. The frequency divider of claim 7, wherein the first set of contiguous flip-flops includes at least two contiguous flip-flops.

9. The frequency divider of claim 7, wherein:

the first set of contiguous flip-flops includes at least two contiguous flip-flops that are directly connected in cascade;

the first set of flip-flops is directly connected to the second set of contiguous flip-flops; and the second set of contiguous flip-flops includes at least two contiguous flip-flops that are directly connected in cascade.

10. A frequency divider for dividing an input signal having a first frequency to generate an output signal having a second frequency, the frequency divider comprising:

an input terminal to receive the input signal;

an output terminal to provide the output signal; and a plurality of flip-flops coupled in series between the input and output terminals, each of the plurality of flip-flops having a clock input to receive the input signal;

wherein the plurality of flip-flops is operatively arranged to form a ring of flip-flops that circulates, through the ring, a bit pattern that repeats at the output terminal at the second frequency; and wherein the plurality of flip-flops includes a first flip-flop, a second flip-flop, and a third flip-flop, an output of the first flip-flop being coupled to an input of the second flip-flop, and an output of the second flip-flop being coupled to an input of the third flip-flop, the frequency divider further comprising a selector, responsive to a selection signal, having first and second inputs and an output, the first input of the selector being coupled to the output of the first flip-flop, the second input of the selector being coupled to an output of the third flip-flop, and the output of the selector being coupled to the input of the second flip-flop, the selector coupling the input of the second flip-flop to one of the output of the first flip-flop and the output of the third flip-flop based upon the selection signal.

11. The frequency divider of claim 10, wherein each of the plurality of flip-flops has an initialization input to receive an initialization signal, the initialization signal initializing a first set of contiguous flip-flops in the ring to a first state, and initializing all flip-flops in the ring other than the first set of contiguous flip-flops to a second state that is opposite the first state, the initialized state of each flip-flop in the ring determining the bit pattern that circulates through the ring.

12. The frequency divider of claim 11, wherein each of the plurality of flip-flops is a D type flip-flop.

13. A method of dividing a frequency of an input signal to generate an output signal having a lower frequency, the method comprising the steps of:

forming a ring of flip-flops coupled together in series;

initializing the flip-flops in the ring so that two of the flip-flops are initialized to different states; and clocking each of the flip-flops in the ring at the frequency of the input signal to generate the output signal at an output of one of the flip-flops in the ring.

14. The method of claim 13, wherein the step of initializing includes a step of initializing the flip-flops asynchronously with respect to the input signal.

15. The method of claim 13, wherein the step of initializing includes steps of:

initializing at least two successive flip-flops in the ring to a first state; and initializing all remaining flip-flops in the ring to a second state that is opposite the first state.

16. The method of claim 13, wherein the step of initializing includes a step of creating a bit pattern to circulate through the ring and repeat at the lower frequency.

17. The method of claim 13, wherein the step of forming the ring includes steps of:

providing a plurality of flip-flops coupled together in series; and selecting only a subset of the plurality of flip-flops to be included in the ring based upon a desired frequency of the output signal.

18. The method of claim 17, further comprising a step of altering a frequency of the output signal by altering which of the plurality of flip-flops are included in the ring.

19. The method of claim 17, wherein the step of initializing includes steps of:

initializing at least two successive flip-flops in the ring to a first state; and initializing all remaining flip-flops in the ring to a second state that is opposite the first state.

20. The method of claim 17, wherein the step of selecting includes a step of:

coupling the plurality of flip-flops to at least one selector that selects which of the plurality of flip-flops are included in the ring.

21. A frequency divider for dividing an input signal having a period and a first frequency to generate an output signal having a second frequency, the frequency divider comprising:

an input terminal to receive the input signal;

an output terminal to provide the output signal;

a plurality of series-connected flip-flops coupled between the input terminal and the output terminal, each of the plurality of series-connected flip-flops being clocked by a clock signal having a same period as the input signal, the plurality of series-connected flip-flops forming a ring; and means, coupled to the plurality of series-connected flip-flops, for selecting one of a plurality of data patterns that circulates through the ring and repeats at the second frequency to generate the output signal.

22. The frequency divider of claim 21, further comprising:

means, coupled to one of the plurality of series-connected flip-flops, for adjusting the second frequency.

23. The frequency divider of claim 21, further comprising means for removing at least one of the plurality of series-connected flip-flops from the ring.

24. A frequency divider for dividing an input signal at a first frequency to generate an output signal at a second frequency, the frequency divider comprising:

an input terminal to receive the input signal;

an output terminal to provide the output signal;

a plurality of series-connected flip-flops coupled between the input terminal and the output terminal and clocked by the input signal the plurality of series-connected flip-flops forming a ring; and means, coupled to the plurality of flip-flops, for creating a data pattern that circulates through the ring and repeats at the second frequency to generate the output signal, wherein the data pattern includes a plurality of bits, and wherein the means for creating the data pattern includes means for setting a first set of consecutive bits in the data pattern to a first state and for setting all remaining bits in the data pattern other than the first set of bits to a second state that is opposite the first state.

25. A frequency divider for dividing an input signal at a first frequency to generate an output signal at a second frequency, the frequency divider comprising:

an input terminal to receive the input signal;

an output terminal to provide the output signal;

a plurality of series-connected flip-flops coupled between the input terminal and the output terminal and clocked by the input signal the plurality of series-connected flip-flops forming a ring; and means, coupled to the plurality of flip-flops, for creating a data pattern that circulates through the ring and repeats at the second frequency to generate the output signal, wherein the means for creating the data pattern includes initialization means, coupled to the plurality of series-connected flip-flops, for initializing a first set of contiguous flip-flops in the ring to a first state, and for initializing all flip-flops in the ring other than the first set of contiguous flip-flops to a second state that is opposite the first state, the initialized state the flip-flops in the ring determining the data pattern that circulates through the ring.

* * * * *